(12) United States Patent
Lin et al.

(10) Patent No.: US 9,170,490 B2
(45) Date of Patent: *Oct. 27, 2015

(54) PHOTOSENSITIVE COMPOSITION AND PHOTORESIST

(71) Applicant: INDUSTRIAL TECHNOLOGY RESEARCH INSTITUTE, Hsinchu (TW)

(72) Inventors: Hsien-Kuang Lin, Hsinchu (TW); Sue-May Chen, Taipei (TW); Jauder Jeng, Taichung (TW); Yu-Lin Liu, Hsinchu County (TW); Su-Huey Chen, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 14 days.

This patent is subject to a terminal disclaimer.

(21) Appl. No.: 14/141,091

(22) Filed: Dec. 26, 2013

(65) Prior Publication Data

US 2015/0056556 A1    Feb. 26, 2015

(30) Foreign Application Priority Data

Aug. 23, 2013   (TW) .............. 102130229 A

(51) Int. Cl.
    G03F 7/004   (2006.01)
    G03F 7/033   (2006.01)
    C08L 33/00   (2006.01)

(52) U.S. Cl.
    CPC ............ G03F 7/033 (2013.01); C08L 33/00 (2013.01)

(58) Field of Classification Search
    CPC .......... G03F 7/003; C08L 33/00; C08L 33/13
    USPC .............. 430/270.1, 281.1, 285.1, 913, 926; 526/318.3
    See application file for complete search history.

(56) References Cited

U.S. PATENT DOCUMENTS

| | | | |
|---|---|---|---|
| 4,645,503 A | 2/1987 | Lin et al. | |
| 5,538,738 A | 7/1996 | Ritter et al. | |
| 6,313,189 B1* | 11/2001 | Wenz et al. | 522/179 |
| 6,743,563 B2 | 6/2004 | Cameron et al. | |
| 7,723,461 B1 | 5/2010 | Wagener et al. | |
| 2003/0022098 A1 | 1/2003 | Koes et al. | |
| 2004/0063025 A1* | 4/2004 | Natori et al. | 430/270.1 |
| 2007/0214987 A1* | 9/2007 | Sonokawa et al. | 101/454 |
| 2008/0004369 A1* | 1/2008 | Seppala | 522/165 |
| 2009/0220753 A1* | 9/2009 | Sugasaki | 428/195.1 |
| 2010/0047140 A1 | 2/2010 | Enomoto et al. | |
| 2012/0141937 A1 | 6/2012 | Lin et al. | |

FOREIGN PATENT DOCUMENTS

| | | |
|---|---|---|
| CN | 102486614 A | 6/2012 |
| JP | 03153750 A * | 7/1991 |
| JP | 2011-032301 A | 2/2011 |
| TW | 201107356 (A) | 3/2011 |
| TW | 201224657 A | 6/2012 |

OTHER PUBLICATIONS

Gripma et al., "Methacrylate-functionalized oligomers based on lactide, e-caprolactone and trimethylene carbonate for application in stereolithography", Materials Research Innovations 10(3), 321-330(2006) (reprtined by e-Polymers).*
Machine translation of JP 2011-032301 (no date).*
Fu et al, "Negative-tone Cycloolefin Photoresist for 193 nm Lithography," Advances in Resist Technology and Processing, 2001, pp. 751-760, vol. XVIII.
Miller et al, "Photopolymerization of biocompatible films containing poly(lactic acid)," European Polymer Journal, 2012, pp. 2107-2116, vol. 48.
Milovanović et al, "Preparation and modification of itaconic anhydride-methyl methacrylate copolymers," *Journal of Serbian Chemical Society*, 2007, pp. 1507-1514, vol. 72, No. 12.
Sandner et al, "Synthesis and characterization of oligo(lactone) methacrylates," Polymer, 1997, pp. 2515-2522, vol. 38, No. 10.
Wallach et al, "Copolymers of Itaconic Anhydride and Methacrylate-Terminated Poly(lactic acid) Macromonomers," Biomacromolecules, 2000, pp. 174-179, vol. 1.

* cited by examiner

*Primary Examiner* — Amanda C Walke

(74) *Attorney, Agent, or Firm* — Muncy, Geissler, Olds & Lowe, P.C.

(57) ABSTRACT

A photosensitive composition and a photoresist are provided. The photoresist is formed by compounding a photosensitive composition. The photosensitive composition includes a binder agent, a first photomonomer, and a photo initiator. The first photomonomer has at least a lactic oligomer and at least two unsaturated acrylic functional groups, wherein the first photomonomer has an amount of about 25-95 parts by weight relative to 100 parts by weight of a solid content of the binder agent. The photoinitiator has an amount of about 0.5-15 parts by weight relative to 100 parts by weight of the solid content of the binder agent.

12 Claims, No Drawings

PHOTOSENSITIVE COMPOSITION AND PHOTORESIST

This application claims the benefit of Taiwan application Serial No. 102130229, filed Aug. 23, 2013, the subject matter of which is incorporated herein by reference.

TECHNICAL FIELD

The disclosure relates in general to a photosensitive composition and a photoresist, and more particularly to a photosensitive composition and a photoresist manufactured from a biomass material.

DESCRIPTION OF THE RELATED ART

For electronic industry, a lithography process such as a printed circuit board process uses a great quantity of photoresist. The conventional photoresist, such as a negative photoresist, is wholly and mainly manufactured from petroleum chemicals such as an acrylate material. After the photoresist is used in a photoresist process, such as a developing process, a stripping process, etc., it becomes a waste product. There are several kilotons of this kind of the waste products produced every year. In addition, the waste products are mostly settled by a burying method or an incinerating method, etc. Therefore, the photoresist consumes a great quantity of petroleum material and has bad effect to nature environment.

SUMMARY

According to an embodiment of the present disclosure, a photosensitive composition is provided. The photosensitive composition comprises a binder agent, a first photomonomer and a photoinitiator. The first photomonomer has at least a lactic oligomer and at least two unsaturated acrylic functional groups, wherein the first photomonomer has an amount of about 25-95 parts by weight relative to 100 parts by weight of a solid content of the binder agent. The photoinitiator has an amount of about 0.5-15 parts by weight relative to 100 parts by weight of the solid content of the binder agent.

According to another embodiment of the present disclosure, a photosensitive composition is provided. The photosensitive composition comprises a binder agent, a first photomonomer and a photoinitiator. The binder agent has a repeating unit I of:

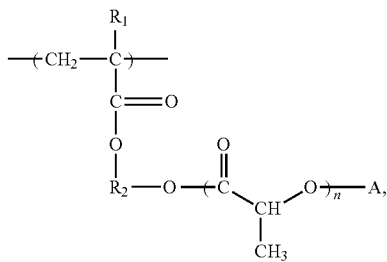

wherein $R_1$ is H or $CH_3$, $R_2$ is $C_2$-$C_4$ alkylene group, n is 2-40 of integer, and A is H or

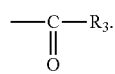

The first photomonomer has at least a lactic oligomer and at least two unsaturated acrylic functional groups, wherein the first photomonomer has an amount of about 25-95 parts by weight relative to 100 parts by weight of a solid content of the binder agent. The photoinitiator has an amount of about 0.5-15 parts by weight relative to 100 parts by weight of the solid content of the binder agent.

According to a further embodiment of the present disclosure, a photoresist is provided. The photoresist is formed by compounding the photosensitive composition.

The following description is made with reference to the accompanying embodiments.

DETAILED DESCRIPTION

In embodiments, a photosensitive composition comprises a binder agent, a first photomonomer, and a photoinitiator.

The binder agent is formed by polymerizing a binder composition. In the embodiments, the binder agent is such as an acrylic binder agent. For example, the binder composition includes a lactic oligomer, and the binder agent is formed by such as copolymerizing the lactic oligomer having unsaturated acrylic function groups. The copolymerization may be carried out by a solution polymerization method by heating.

The first photomonomer has at least a lactic oligomer and at least two unsaturated acrylic functional groups. The first photomonomer has an amount of about 25-95 parts by weight relative to 100 parts by weight of a solid content of the binder agent.

The photoinitiator has an amount of about 0.5-15 parts by weight relative to 100 parts by weight of the solid content of the binder agent.

The lactic oligomer is mainly formed from raw materials of lactic acid and unsaturated monomer. Since the lactic acid is a biomass material, which is renewable, and thus the photoresist made therefrom is bio-degradable and reusable. In addition, in the embodiments, the lactic oligomer has unsaturated acrylic functional groups and thus is able to conduct radical copolymerization with other unsaturated monomers, thereby a binder agent having a high molecular weight can be synthesized. Besides, the mass production of the lactic oligomer is easy with low cost. Moreover, the lactic oligomer is a degradable material, having no adverse effect on and less burden to natural environments.

In the embodiments, the weight ratio of the lactic oligomer of the binder composition to the solid content of the binder agent is about 10%-90%.

In the embodiments, the photosensitive composition may be compounded for forming a photoresist, such as a negative photoresist. In the embodiments, the photoresist has a high acid-resistivity, a high glass transition temperature (Tg), and is bio-degradable.

In an embodiment, after the copolymerization, the chemical structure of the binder agent has a repeating unit I of:

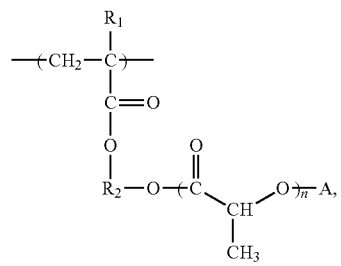

wherein $R_1$ is H or $CH_3$, $R_2$ is $C_2$-$C_4$ alkylene group, n is 2-40 of integer, and A is H or

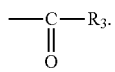

In another embodiment, after the copolymerization, the chemical structure of the binder agent may further have a repeating unit II of:

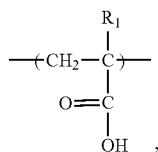

wherein $R_1$ is H or $CH_3$.

In a further embodiment, after the copolymerization, the chemical structure of the binder agent may further have a repeating unit III of:

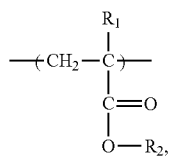

wherein $R_1$ is H or $CH_3$, and $R_2$ is $C_2$-$C_4$ alkyl group.

In the embodiments, the binder composition may further comprise other reactive monomers, including a carboxyl group-containing unsaturated monomer, a carboxyl group-free unsaturated monomer, or a solvent.

The carboxyl group-containing unsaturated monomer may comprise, for example, acrylic acid, methyl acrylic acid, cis-butenedioic acid, trans-butenedioic acid, or itaconic acid, etc. In one embodiment, the weight ratio of the carboxyl group-containing unsaturated monomer to the solid content of the binder agent may be about 5%-45%. Among the above-mentioned monomers, itaconic acid having unsaturated double bonds could be manufactured by a fermentation process, and itaconic acid is a renewable biomass material.

The carboxyl group-free unsaturated monomer may comprise acrylate monomer(s), such as methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, hexyl acrylate, hexyl methacrylate, etc., and may comprise other unsaturated monomers, such as acrylamide, acrylonitrile, or styrene, etc. In some embodiments, the weight ratio of the carboxyl group-free unsaturated monomer to the solid content of the binder agent may be about 0.1%-85%. However, the present disclosure is not limited thereto. In other embodiments, the addition of the carboxyl group-free unsaturated monomer may be not necessary.

In some embodiments, the carboxyl group-containing monomer, such as acrylic acid or methacrylic acid, is used in synthesizing the binder composition, such that the photosensitive composition conforms to a requirement for a liquid alkali developing. In addition, the hydrophilicity of the photosensitive composition can be improved. The type(s) and the quantity of the carboxyl group-free unsaturated monomer may be adjusted for adjusting the hydrophilicity and the glass transition temperature (Tg) of the binder agent according to the conditions applied. The higher the hydrophilicity of the binder agent is, the better the homogeneity to water and the developing property of the whole photosensitive composition is improved, yet a decrease of the adhesive strength of the binder agent may occur as well. The Tg of the binder agent affects the viscidity of the pre-baked photosensitive composition, while a too low Tg would result in the formation of a wet and sticky photosensitive layer (or photoresist), which is disadvantageous to the operation of an image transfer process.

In some embodiments, the binder agent is synthesized by a solution polymerization method. A suitable solvent may comprise, for example, dichloromethane, chloroform, tetrachloromethane, acetone, methyl ethyl ketone, ethyl alcohol, propyl alcohol, isopropyl alcohol, butyl alcohol, diethyl ketone, propylglycol monomethylether, or propyleneglycol monomethyl ether acetate, etc. In one embodiment, the solvent may have an amount of about 40-200 parts by weight relative to 100 parts by weight of the solid content of the binder agent. If the quantity of solvent is less than the lower limit, the viscosity of the photosensitive solution would be too high, rendering it difficult to coat the photosensitive solution. Since the reaction temperature of the thermal polymerization is determined according to the initiator used, while the reaction temperature is higher than the boiling point of the solvent, the polymerization is required to be proceeded under a pressurized condition; otherwise, the solvent may evaporate during the reaction. The polymerization temperature applied is usually about 50° C.-130° C. In some embodiments, due to the solubility of the binder agent, two or more types of solvents may be used for the polymerization.

In the embodiments, the chemical structure of the first photomonomer is represented as a chemical formula of:

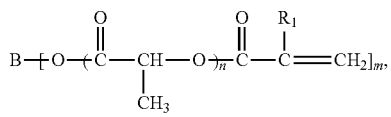

wherein $R_1$ is H or $CH_3$, n is 2-40 of integer, m is 2-6 of integer, and B is a multi-functional moiety.

In one embodiment, the chemical structure of the first photomonomer may be represented as, for example, a chemical formula of:

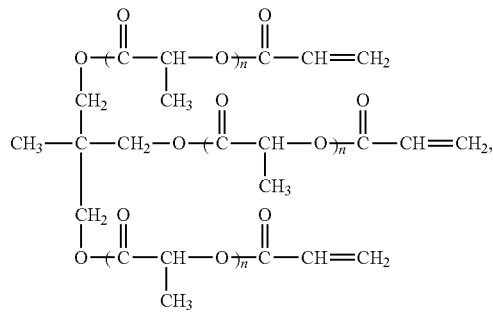

wherein n is 2-40 of integer.

The photomonomer having at least a lactic oligomer may be formed from at least a polyol and at least a lactic acid by a chain extension reaction, followed by the reaction with acrylic acid or methacrylic acid.

In addition to the first photomonomer, which has a lactic oligomer, the photosensitive composition of the present disclosure may optionally further comprise a second photomonomer having no lactic oligomer. In the embodiments, the combination of the first photomonomer and the second photomonomer may have an amount of about 25-95 parts by weight relative to 100 parts by weight of the solid content of the binder agent.

The addition of the second photomonomer, which has no lactic oligomer, may speed up the polymerization under UV exposure for increasing the photosensitivity. A suitable amount of the addition of the photomonomer(s) may prevent the photosensitive composition from being too stiff, which is disadvantageous to the copolymerization. If the total amount of the photomonomer(s) exceeds 95 parts by weight, the surface of the photosensitive composition would be wet and sticky. Normally, the photosensitive composition would have a higher degree of crosslink as the amount of the unsaturated double bonds of each molecule of the photomonomer(s) increases, which makes the photoresist resist etching from an etching solution or an electroplating solution more easily.

In some embodiments, the second photomonomer may comprise dipentaerythritol pentaacrylate, dipentaerythritol hexaacrylate, aromatic urethane hexaacrylate, trimethylolpropane triacrylate, ethoxylated trimethylolpropane triacrylate, trimethylolpropane trimethacrylate, ethoxylated trimethylolpropane trimethacrylate, pentaerythritol triacrylate, pentaerythritol trimethacrylate, pentaerythritol tetraacrylate or pentaerythritol tetramethacrylate.

In some embodiments, the photoinitiator comprises benzil dimethyl ketal, 2,4-diethylthioxanthone, isopropylthioxanthone, 2-methyl-1-(4-(methylthio)phenyl)-2-morpholinopropanone-1 or benzophenone. The photoinitiator having strong photodegradation ability should be selected for avoiding a decrease of the degree of crosslink of the surface due to oxygen inhibition.

In some embodiments, the photosensitive composition may further comprise a sensitizer, together with the photoinitiator, for increasing the photosensitivity. The sensitizer may comprise 2-dimethyl aminoethyl benzoate, ethyl (p-dimethylamino)benzoate or 4,4'-bis(N,N-dimethylamino)benzophenone (Michler's ketone), etc. The sensitizer may have an amount of about 0.1-5 parts by weight relative to 100 parts by weight of the solid content of the binder agent. However, the present disclosure is not limited thereto. In other embodiments, the addition of the sensitizer is not necessary.

In other embodiments, the photosensitive composition may further comprise a plasticizer. The plasticizer may be a compound having a low molecular weight and a high boiling point. The plasticizer may diffuse into and swell the microstructure of a resin. The plasticizer can be used for softening the photosensitive composition for promoting the photo-curing process. The plasticizer may comprise a phosphate, such as tricresyl phosphate, triphenyl phosphate, tributyl phosphate, tris(2-ethylhexyl) phosphate; polyethylene glycol, polypropylene glycol, triethylene glycol, triethylene glycol diacetate, triethylene glycol dipropionate, triethylene glycol diacrylate, tetraethylene glycol, tetraethylene glycol diacetate, tetraethylene glycol diheptanoate, diethyl adipate; a phthalate, such as dioctyl phthalate, diundecyl phthalate, dicyclohexyl phthalate, diphenyl phthalate, butyl benzyl phthalate, etc.

For the photosensitive compositions to achieve a desired and proper property, a suitable additive agent may be added according to the conditions required. The additive agent may be such as an antifoaming agent, a leveling agent, a coloring material, a slipping agent, an adhesion promoter, a thixotropic agent, a sensitizer, and/or a filler, etc.

Examples and a comparative example of the present disclosure are illustrated as following.

1. Lactic Oligomer

Reactants, comprising 172.96 g of L-lactide, 39.04 g of 2-hydroxyethyl methacrylate (HEMA), 0.30 g of stannous 2-ethylhexanoate of a catalyst, and 0.06 g of 4-Methoxyphenol (MEHQ) of a stabilizer, are added into a three-necked reaction bottle. The reaction bottle is then placed in an oil bath at 100° C. while the reactants in the bottle are flowed with air. After the reactants are stirred at a speed of 250 rpm and reacted for 12 hours, the lactic oligomer (PLA-HEMA macromonomer) is obtained.

2. Binder Agent I (with Biomass Material)

A four-necked reaction bottle is heated to a temperature of 90° C. and filled with nitrogen gas. A clear mixture solution, comprising 190.52 g of the lactic oligomer, 47.83 g of methacrylic acid, 18.21 g of methyl methacrylate, 316.0 g of propyleneglycol monomethyl ether acetate, and 3.68 g of N,N'-azobisisobutyronitrile, is added into the four-necked reaction bottle. The reaction is then continued for 7 hours. After that, the binder agent I is obtained. The binder agent I has a solid content of 45%, Tg of 54.4° C., and a weight-average molecular weight of 75,000.

The synthesized binder agent I has repeating units of:

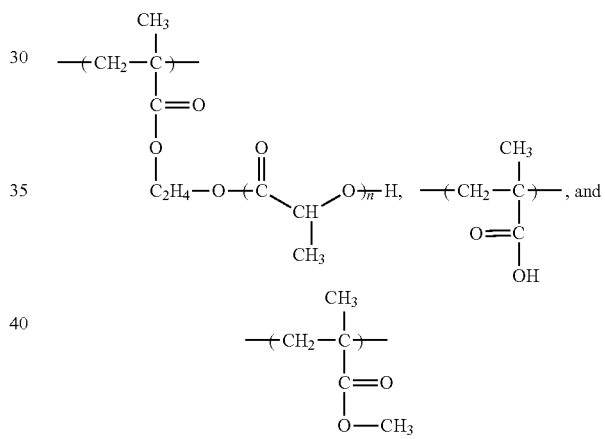

3. Binder Agent II (with Petrochemical Material)

A four-necked reaction bottle is heated to a temperature of 90° C. and filled with nitrogen gas. A clear mixture solution, comprising 137.31 g of butyl methacrylate, 100.83 g of methacrylic acid, 22.37 g of methyl methacrylate, 316.0 g of propyleneglycol monomethyl ether acetate, and 1.51 g of N,N'-azobisisobutyronitrile, is added into the four-necked reaction bottle. The reaction is then continued for 7 hours. After that, the binder agent II is obtained. The binder agent II has a solid content of 45%, Tg of 62.4° C., and a weight-average molecular weight of 45,000.

The synthesized binder agent II has repeating units of:

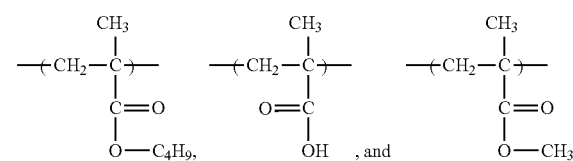

4. First Photomonomer (with Lactic Oligomer)

A four-necked reaction bottle is heated to a temperature of 130° C. and filled with nitrogen gas. A clear mixture solution, comprising 27.65 g of glycerol, 183.00 g of lactic acid, 68.43 g of acrylic acid, 1.10 g of p-toluene sulfonic acid, and n-heptane, is added into the four-necked reaction bottle and refluxed for 16 hours. And then, after the solvent and byproduct(s) are removed by vacuum distillation, 215.0 g of the photomonomer having the lactic oligomer is obtained.

The constituents of photosensitive compositions of examples 1-4 and comparative example 1 are as shown in Table 1, and the ratios are represented as parts by weight.

TABLE 1

| Constituent | Example 1 | Example 2 | Example 3 | Example 4 | Comparative example 1 |
|---|---|---|---|---|---|
| Binder agent I | 222.2 | 222.2 | 222.2 | 222.2 | — |
| Binder agent II | — | — | — | — | 222.2 |
| First photomonomer | 50.0 | 40.0 | 40.0 | 35.0 | — |
| Trimethylolpropane triacrylate | 0.0 | 10.0 | 10.0 | 15.0 | 50 |
| Tricresylphosphate | — | — | 10.0 | — | — |
| 2-Dimethylaminoethyl benzoate | 0.5 | 0.5 | 0.5 | 0.5 | 0.5 |
| 2,2-dimethoxy-1,2-di(phenyl)ethanone (Irgacure 651, Ciba Specialty Chemicals) | 4.0 | 4.0 | 4.0 | 4.0 | 4.0 |
| Hydroquinone | 0.5 | 0.5 | 0.5 | 0.5 | 0.5 |
| Blue 603 (dye, Kelly Int. Corp.) | 1.0 | 1.0 | 1.0 | 1.0 | 1.0 |
| Methyl ethyl ketone | 60.0 | 60.0 | 60.0 | 60.0 | 60.0 |

Each photosensitive composition listed above is stirred and mixed uniformly. After the photosensitive composition is coated onto a PET substrate by a bar coating process, the substrate is dried in a drying oven at 100° C. for 2 minutes. After the photosensitive film is cooled, it is laminated onto a copper foil substrate by a laminating machine at 100° C.-120° C. Next, the photosensitive film is exposed to UV light by an UV exposure machine with an exposing energy of 80 mJ/cm². Then, an aqueous solution of 1.0% sodium carbonate ($Na_2CO_{3(aq)}$) is used to develop the film for exposing the to-be-etched portion of the copper foil. After the substrate is etched by an aqueous solution of copper chloride ($CuCl_{2(aq)}$), the photoresist film is stripped by an aqueous solution of 1% sodium hydroxide ($NaOH_{(aq)}$).

Next, tests of photosensitivity, resolution, adhesion, residue, stripping time, and etching resistance are performed to the photoresist films made from the compositions of examples 1-4 and comparative example 1 as shown in Table 1.

The followings are the description of the tests. The results of the photosensitivity tests are represented by grid numbers. The optical densities (OD) of the grids on the step tablet are different from one another. The light transmittance is different from grid to grid, while the first grid has the lowest optical density, the highest light transmittance, and the highest photosensitivity of the photoresist, and the optical density increases from grid to grid by a certain amount (ratio) of optical density. A twenty-one grid table is taken as an example; as the first grid has an optical density of 0.05, the optical density increases from grid to grid by 0.15, and the light transmittance decreases to $1/\sqrt{2}$ of the original amount. The results of the resolution tests are represented by the minimum line widths/line spaces of the patterns of the photoresist films after being developed and dried. The results of the adhesion tests are represented by the completely-adhered minimum line widths of the photoresist films after being developed and dried. The results of the residue tests are represented by whether dried residues remain on the un-photosensitized and un-cured regions of the photoresist films after being developed. The results of the etching resistance tests are represented by whether the patterns of the photoresist films remain intact after being developed and dried.

Table 2 shows the test results of the photoresist films of the examples 1 to 4 and the comparative example.

TABLE 2

| Photoresist films | Example 1 | Example 2 | Example 3 | Example 4 | Comparative example 1 |
|---|---|---|---|---|---|
| photosensitivity (grid number) | 7 | 5 | 6 | 6 | 6 |
| resolution (μm) | 60 | 50 | 50 | 50 | 60 |
| adhesion (μm) | 60 | 60 | 60 | 50 | 60 |
| residue (scum) | None | None | None | None | None |
| stripping time (second) | 35 | 31 | 29 | 32 | 31 |
| etching resistance | OK | OK | OK | OK | OK |

From the results as shown in Table 2, it is found that the excellent photosensitivity, high developing property, high resolution, high adhesion, high corrosion resistance, and rapid stripping properties of the photoresist of the examples of present disclosure are similar to those of the photoresist film of the comparative example. In other words, the photoresist formed from the photosensitive compositions according to the embodiments of the present disclosure show equally superior characteristics, which is comparable with those of the photoresist films made from conventional petrochemical materials. Moreover, the photoresist formed from the photosensitive compositions according to the embodiments of the present disclosure are bio-degradable, thus having no adverse effect on and no burdens to natural environments.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A photosensitive composition, comprising:
   a binder agent;
   a first photomonomer having at least a lactic oligomer and at least two unsaturated acrylic functional groups, wherein the first photomonomer has an amount of about 25-95 parts by weight relative to 100 parts by weight of a solid content of the binder agent; and
   a photoinitiator, wherein the photoinitiator has an amount of about 0.5-15 parts by weight relative to 100 parts by weight of the solid content of the binder agent, wherein the photosensitive composition is free from an oxy compound of at least one of metal and metalloid selected from Groups 1 to 16 of periodic table.

2. A photosensitive composition, comprising:
a binder agent, wherein the binder agent has a repeating unit I of:

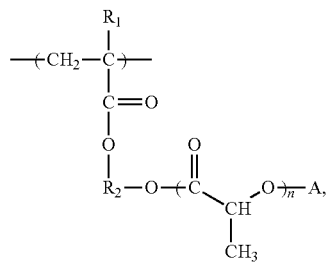

wherein $R_1$ is H or $CH_3$, $R_2$ is $C_2$-$C_4$ alkylene group, n is 2-40 of integer, and A is H;
a first photomonomer having at least a lactic oligomer and at least two unsaturated acrylic functional groups, wherein the first photomonomer has an amount of about 25-95 parts by weight relative to 100 parts by weight of a solid content of the binder agent; and
a photoinitiator, wherein the photoinitiator has an amount of about 0.5-15 parts by weight relative to 100 parts by weight of the solid content of the binder agent, wherein the photosensitive composition is free from an oxy compound of at least one of metal and metalloid selected from Groups 1 to 16 of periodic table.

3. The photosensitive composition according to claim 2, wherein the first photomonomer is represented as a chemical formula of:

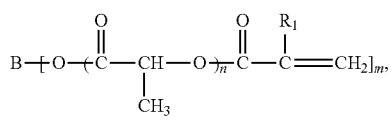

wherein $R_1$ is H or $CH_3$, n is 2-40 of integer, m is 2-6 of integer, and B is a multi-functional moiety.

4. The photosensitive composition according to claim 3, wherein the first photomonomer is represented as a chemical formula of:

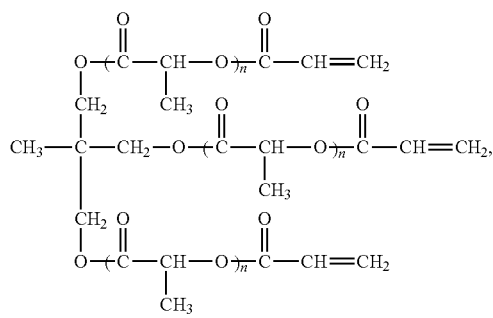

wherein n is 2-40 of integer.

5. The photosensitive composition according to claim 2, wherein the photoinitiator comprises benzil dimethyl ketal, 2,4-diethylthioxanthone, isopropylthioxanthone, 2-methyl-1-(4-(methylthio)phenyl)-2-morpholinopropanone-1, or benzophenone.

6. The photosensitive composition according to claim 5, further comprising a sensitizer comprising 2-dimethyl aminoethyl benzoate, ethyl (p-dimethylamino) benzoate, or 4,4'-bis(N,N-dimethylamino)benzophenone, wherein the sensitizer has an amount of about 0.1-5 parts by weight relative to 100 parts by weight of the solid content of the binder agent.

7. The photosensitive composition according to claim 2, wherein the binder agent is formed by polymerizing a binder composition comprising a lactic oligomer, and the weight ratio of the lactic oligomer of the binder composition to the solid content of the binder agent is about 10%-90%.

8. The photosensitive composition according to claim 2, further comprising a second photomonomer, wherein the second photomonomer comprises dipentaerythritol pentaacrylate, dipentaerythritol hexaacrylate, aromatic urethane hexaacrylate, trimethylolpropane triacrylate, ethoxylated trimethylolpropane triacrylate, trimethylolpropane trimethacrylate, ethoxylated trimethylolpropane trimethacrylate, pentaerythritol triacrylate, pentaerythritol trimethacrylate, pentaerythritol tetraacrylate or pentaerythritol tetramethacrylate.

9. The photosensitive composition according to claim 2, wherein the binder agent has a repeating unit II of:

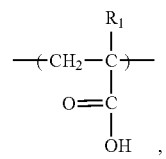

wherein $R_1$ is H or $CH_3$.

10. The photosensitive composition according to claim 9, wherein the binder agent has a repeating unit III of:

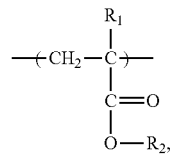

wherein R1 is H or CH3, and R2 is C2-C4 alkyl group.

11. A photoresist, comprising the photosensitive composition according to claim 1.

12. A photoresist, comprising the photosensitive composition according to claim 2.

* * * * *